United States Patent
Momtaz

[19]

[11] Patent Number: 6,144,223
[45] Date of Patent: Nov. 7, 2000

[54] INTEGRATED CIRCUIT SCSI INPUT RECEIVER HAVING PRECISION HIGH SPEED INPUT BUFFER WITH HYSTERESIS

[75] Inventor: Afshin D. Momtaz, Irvine, Calif.

[73] Assignee: Adaptec, Inc., Milpitas, Calif.

[21] Appl. No.: 09/525,873

[22] Filed: Mar. 15, 2000

Related U.S. Application Data

[62] Division of application No. 09/055,105, Apr. 3, 1998.
[51] Int. Cl.$^7$ ............................................. H03K 19/0175
[52] U.S. Cl. .................................. 326/83; 326/34; 326/27; 327/205
[58] Field of Search .................................. 326/83, 86, 87, 326/31, 32, 34, 26, 27; 327/77, 205

[56] References Cited

U.S. PATENT DOCUMENTS

| | | | |
|---|---|---|---|
| 5,386,153 | 1/1995 | Voss et al. | 326/34 |
| 5,498,985 | 3/1996 | Parle et al. | 327/74 |
| 5,532,620 | 7/1996 | Seo et al. | 326/81 |
| 5,594,361 | 1/1997 | Campbell | 326/24 |
| 5,886,556 | 3/1999 | Ganger et al. | 327/206 |
| 5,912,569 | 6/1999 | Alleven | 327/108 |

*Primary Examiner*—Michael Tokar
*Assistant Examiner*—James H Cho
*Attorney, Agent, or Firm*—Martine Penilla & Kim, LLP

[57] ABSTRACT

A high-speed SCSI input receiver has separate high and low level input buffers, each operating in response to a control voltage that conditions their respective high and low level switching threshold voltages to remain stable about their design values without regard to temperature and process parameter variations. Each of the input buffers includes an input invertor with n-channel and p-channel current source transistors coupled between the output and the respective supply rails. A master circuit includes circuitry that substantially matches the operative circuitry of the input buffer, except that the input and output of the master circuit's invertor element are coupled together so as to define the elements actual switching threshold voltage. This threshold voltage is compared to a design threshold voltage defined by a resistor divider in a comparator. The comparator output defines a control voltage which drives the n-channel and p-channel current source transistors until the actual switching threshold voltage of the master circuit's invertor equals the design switching threshold voltage defined by the resistor divider. The control voltage is parallel connected to the n-channel and p-channel current source transistors of the input buffer which causes the input buffer to exhibit an actual switching threshold voltage substantially equal to the design switching threshold voltage without regard to variations in temperature and process parameter tolerances.

2 Claims, 5 Drawing Sheets

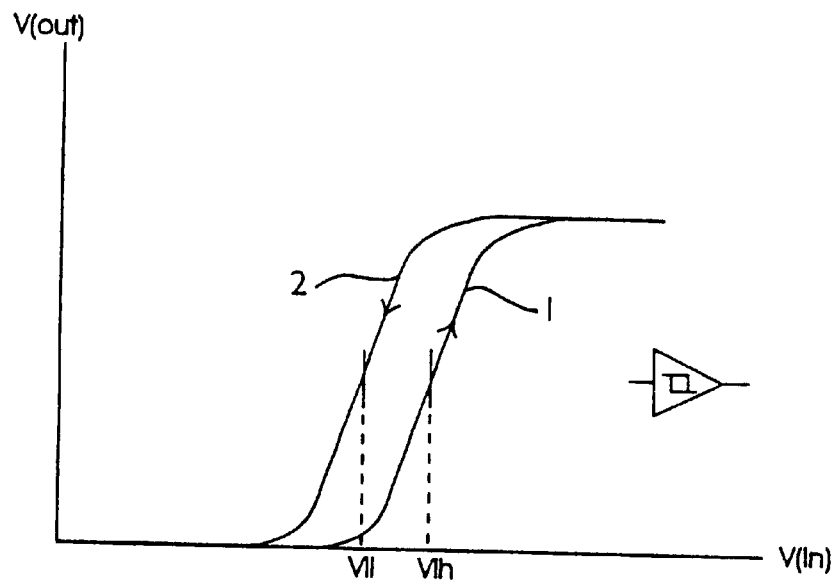
FIG.1
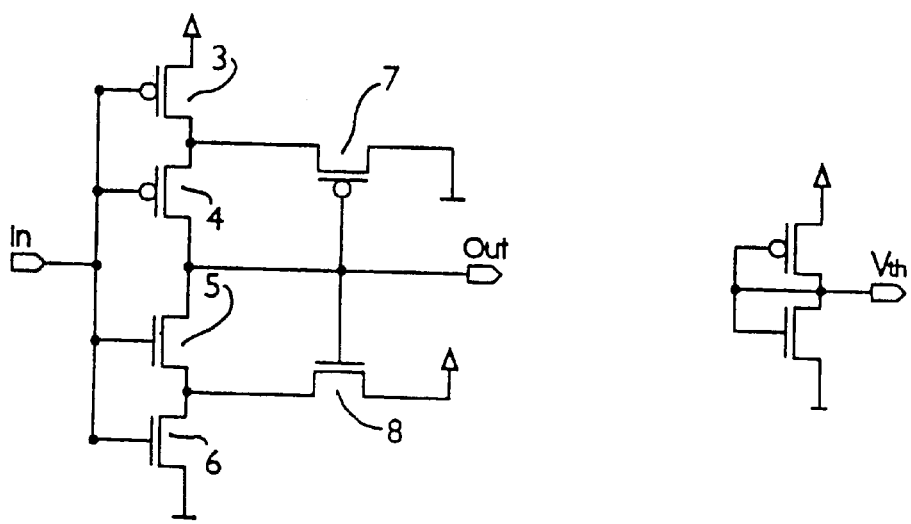
FIG.2a  FIG.2b

INTEGRATED CIRCUIT SCSI INPUT RECEIVER HAVING PRECISION HIGH SPEED INPUT BUFFER WITH HYSTERESIS

This application is a Division of Ser. No. 09/055,105 filed Apr. 3, 1998.

FIELD OF THE INVENTION

The present invention relates generally to electronic systems having an SCSI interface. In particular, the invention relates to an integrated circuit, adapted for connection to an SCSI bus, in which the input receiver has buffer thresholds substantially independent of temperature and process variations.

BACKGROUND OF THE INVENTION

The SCSI interface may be best described as a device independent input/output bus which allows a variety of peripheral devices to be connected to a personal computer system. SCSI refers to Small Computer Systems Interface, and was initially developed to provide a disk drive interface that supported logical addressing of data rather than the more prevalent physical addressing. In addition, the SCSI interface was developed to transfer information in parallel, byte-wise fashion instead of serially, thus, ending certain compatibility difficulties associated with developing new disk drive technologies and bringing them to the market place. The electrical characteristics and signal protocols of the SCSI interface were developed in such a manner that the requirements of various peripheral devices could be accommodated with relative ease and flexibility. In particular, the SCSI interface protocol defines a number of commands which are available for accessing and querying a particular peripheral device regarding the parameter set required for the device to operate correctly. This particular feature of the SCSI interface makes it possible for a system designer to write a software device driver program for a generalized peripheral device, without regard to specific parameter set details.

In accordance with various versions of the SCSI interface, such as SCSI-1, SCSI-2, and SCSI-3, anywhere from 8 to 32 individual peripheral devices can be addressed on an SCSI bus depending on whether the bus is an 8-bit bus, a 16-bit bus or a 32-bit bus. These devices are generally categorized as initiators and targets, with any particular peripheral device able to play either role at a particular point in time. Specifically, a peripheral device functioning as an initiator, is a device that initiates an information transaction or data transfer by giving another peripheral device a particular task to perform. An example of an initiator might well be the SCSI host adapter of a personal computer system, while an example of a typical target device might well be a rotating disk data storage system such as a hard disk drive or CD-ROM. A target peripheral device may be thus seen as a device which carries out the task identified by the initiator.

As mentioned previously, the SCSI bus may be from 8 to 32 bits wide, depending on configuration, with the conventional, SCSI-1 bus being an 8-bit wide bus comprising 18 separate signals; 8 data bits, a parity bit and 9 protocol signal lines, in addition to a five volt power supply line for termination. In accordance with the SCSI specification, these signals (with the exception of the terminator power supply) are either a single ended active-low signals or differential signals defined by output driver circuitry on the initiator and target devices. In accordance with the SCSI interface specification, the signal swing of output drivers from a, for example, SCSI controller chip is defined as a minimum $V_{OL}$ of about 0.8 volts to a maximum $V_{OH}$ of 3.7 volts DC. Although a larger $V_{OH}$ value would not necessarily degrade the signal performance of various SCSI integrated circuits coupled to the bus, taking $V_{OH}$ higher than about 3.8 volts does have a significant effect on the overall power consumption of an SCSI system.

In particular, because inactive signal lines of the bus are pulled-up to approximately 2.5 volts by terminators, it will be understood that if an active high from an output driver were to pull an inactive signal up to a value exceeding 3.5 volts to about 3.8 volts, a significant voltage differential would be established between an output driver in the pull-up state and the bus, thus causing significant amounts of current to be sourced to the bus resulting in disadvantageous drops along the bus and very high power consumption levels. In addition, this tendency would be substantially magnified were the SCSI bus to be heavily populated, and in a generally inactive state. Such a situation would likely obtain where an SCSI bus was coupled between the multiple initiators and multiple target devices and where a host computer was engaged in processing operations requiring very few peripheral calls.

Such constraints, on both signal swings and minimum and maximum output voltage levels, pose a significant challenge to an integrated circuit designer when attempting to develop circuits that communicate with the SCSI bus. Given the relatively small signal swings and the lack of significant head room between $V_{OL}$ and $V_{OH}$, along with the need to maintain both of these quantities within relatively strictly defined limits, it will be further understood that SCSI circuit input receivers need to be able to accurately differentiate between high and low voltage levels, as well as translate these narrowly defined signals into rail-to-rail values suitable for further processing using CMOS integrated circuit technology.

Pertinent to these requirements is that SCSI input receivers need to be designed with a certain degree of hysteresis, such that there are well defined low and high level input threshold voltages. In particular, it is desirable for an SCSI input receiver to have an "input threshold high" ($V_{IH}$) of about 1.75 volts and an "input threshold low" ($V_{IL}$) of about 1.15 volts at nominal integrated circuit manufacturing process centers.

The prior art has developed various forms of integrated circuit input receivers with these particular signal response characteristics. One of the more common forms of threshold circuits comprising SCSI input receivers is a Schmitt trigger. FIG. 1 illustrates the voltage transfer characteristic of an ideal non-inverting Schmitt trigger circuit which is designed to be resistant to small variations of the input voltage and requires that the input voltage pass through high and low level trigger values in order to induce a change in the output. As shown generally in FIG. 1, the Schmitt trigger output characteristic follows voltage trace 1, such that the output signal $V_{OUT}$ does not rise until the input voltage $V_{IN}$ rises above a turn-on voltage threshold $V_{IH}$. Likewise, the Schmitt trigger input voltage $V_{IN}$ must fall below a turn-off voltage threshold $V_{IL}$, before the output voltage falls from its maximum value to about 0.0 volts, as indicated in voltage trace 2.

A prior art-type non-inverting CMOS Schmitt trigger circuit is depicted in the schematic circuit diagram of FIG. 2, and includes two source-drain series-connected p-channel transistors, 3 and 4, connected in series fashion with two source-drain series-connected n-channel transistors, 5 and 6.

Each of the p-channel and n-channel series connected transistors have their gate terminals connected in common and to a signal input. An output is defined at the source-drain node between the p-channel series (transistors 3 and 4) and the n-channel series (transistors 5 and 6).

A third p-channel device 7 is coupled between ground potential and the source-drain junction node between the p-channel series transistors 3 and 4. Likewise, a third n-channel transistor 8 is coupled between the power supply voltage and the source-drain node between the n-channel series transistors 5 and 6. The gate terminals of the third transistors 7 and 8 are connected in common and to the output of the series stack.

In operation, it will be understood by those having skill in the art that the turn-on threshold voltage level $V_{IH}$ depends on the relative sizings of the n-channel transistors 5, 6 and 8, while the turn-off threshold voltage level $V_{IL}$ depends on the relative sizings of the p-channel transistors 3, 4 and 7. For example, in order to switch the output from high to low, the p-channel series stack (transistors 3 and 4) must overcome the grounding effects of p-channel transistor 7, while to switch the outputs from low to high, the n-channel stack (transistors 5 and 6) must overcome the effects of the supply voltage provided by n-channel transistor 8. The actual switch points of each of the circuit legs depends, necessarily, on providing the proper relative sizes for each of the transistors, in order to provide the appropriate degree of hysteresis.

While generally recognized as offering a reasonably cost-effective input receiver design with the necessary degree of hysteresis, conventional Schmitt triggers exhibit signal response characteristics which are found to be sensitive to variations in circuit temperature as well as variations in integrated circuit manufacturing process tolerances. Such variations in signal response significantly impact the voltage hysteresis and the circuit's speed, as well as its absolute switching points. Process tolerance variations often tend to either magnify or reduce the designed separation between the $V_{IL}$ and $V_{IH}$ thresholds, as those threshold voltages are caused to drift by process tolerance spread. This threshold voltage drift is particularly disadvantageous in SCSI systems, where the signal environment is predicated on terminated transmission lines with their attendant resonances and reflections.

Alternative prior art-type circuitry, which attempts to more particularly define input threshold voltages, typically include separate high and low level input sections, each comprising an input inverter configured with its own particular switching threshold voltage. As depicted in FIG. 2b, a particular inverter's switching threshold ($V_{TH}$) is defined as the voltage developed when the input is shorted to the output. Each of the high and low level input sections would then be comprised of an inverter with its component transistors particularly sized to develop the necessary threshold voltage. In a manner similar to one which will be described in connection with FIG. 3, the outputs of the high and low level blocks would be multiplexed by logic gates to develop a unitary output. While these circuits are relatively simple in concept, it is generally understood that they are also quite sensitive to variations in circuit temperature as well as variations in integrated circuit manufacturing process tolerances. Accordingly, such circuits also exhibit performance deficiencies that make them disadvantageous for use in an SCSI input receiver.

Accordingly, it will be seen that there is a need for an input buffer for an SCSI input receiver with a definable hysteresis characteristic such that it switches about well defined high and low level input thresholds, and adequately translates SCSI bus signal characteristics to CMOS rail-to-rail levels. Such an input buffer should be able to internally develop both low and high level switching thresholds and, additionally, maintain the low and high level switching threshold voltage values across specification allowable temperature extremes and across integrated circuit manufacturing process tolerance corners.

SUMMARY OF THE INVENTION

There is provided in accordance with one aspect of the present invention a high-speed SCSI input receiver configured to operate about high and low level switching thresholds, with each of the switching threshold voltages being stabilized to operate within +/−5% of their nominal design value without regard to operating temperature and process parameter variations. The high speed SCSI input receiver comprises high-level and low-level input buffers with each having respective first and second switching threshold voltages and each coupled to receive an input signal from, for example, an SCSI bus. The high and low level input buffers each produce an output in response to the input signal, which output is coupled to a logic circuit configuration, comprising NAND gates configured as a latch. The logic circuitry defines the input receiver's output and functions to ensure that the output does not switch from low-to-high or from high-to-low until the appropriate input threshold voltages of the high and low level input buffers have been triggered by an input signal.

In particular, each of the high and low level input buffers suitably comprises an input invertor circuit constructed of a p-channel transistor in series with an n-channel transistor commonly connected at their drain nodes so as to define an output. Each of the high and low level input buffers further comprises a p-channel current source transistor coupled between a power supply and the common drain node of the invertor and an n-channel current source transistor coupled between the common drain node and ground potential. The gates of the n-channel and p-channel current sources are coupled to and controlled by a control voltage which is generated to have a value such that the current source transistors condition the output of the input invertor to switch about its nominal design switching threshold voltage without regard to temperature or process parameter variations.

In order to ensure that the appropriate low and high level input threshold voltages are maintained at their nominal design values, high and low level threshold setting master circuits respectively define high and low level threshold control voltages which are directed to the current source transistors of the high and low level input buffers. Each threshold setting master circuit suitably comprises circuitry that substantially matches the operative circuitry of its respective input buffer and includes an input invertor element comprising p-channel and n-channel transistors commonly connected at their drain nodes to define an output and with their inputs connected to the output so as to define their respective switching threshold voltages. Each threshold setting master circuit further comprises a p-channel current source transistor coupled between the power supply and the common drain node of the inverter and an n-channel transistor coupled between the common drain node and ground potential. The gate terminals of the p-channel and n-channel current source transistors of the threshold setting master circuit are connected together in common and further coupled to the output of a comparator circuit.

The comparator circuit has a non-inverting input connected to the output of the switching threshold voltage setting invertor element, such that the switching threshold voltage of the invertor element defines a first comparison voltage. The inverting input of the comparator is connected to the center tap of a resistor divider network which is constructed of ratioed integrated circuit resistors. The value of each of the resistors of the resistor divider is determined so as to define a voltage at the center tap of the divider which is equal to the design switching threshold voltage of the master circuit's respective high or low level input buffer. Thus, the voltage taken from the resistor divider center tap, i.e., the reference voltage, defines a second comparison voltage which is compared to the actual switching threshold voltage defined by the master circuit's invertor element.

Temperature and process parameter induced shifts in the actual switching threshold voltage of the master circuit's invertor element cause the comparator circuit to output a control voltage which is directed to the gate terminals of the p-channel and n-channel current source transistors of the master circuit. If the switching threshold voltage of the master circuit's invertor is greater than the design switching threshold voltage, i.e., the reference voltage, a positive control voltage will cause the n-channel current source transistor to preferably conduct, thereby reducing the output voltage (switching threshold voltage) of the invertor element until such time as the switching threshold voltage is equal to the reference voltage.

The control voltage, so developed, is further directed to the gate terminals of the input buffer's p-channel and n-channel current source transistors which likewise condition the common drain output node of the input buffer's input invertor so as to condition the input buffer's switching threshold voltage to be equal to the design switching threshold voltage defined by the reference voltage.

BRIEF DESCRIPTION OF THE DRAWINGS

These and other features, aspects, and advantages of the present invention will be more fully understood when considered with respect to the following detailed description, appended claims and accompanying drawings, wherein:

FIG. 1 is a simplified voltage transfer characteristic of an ideal non-inverting Schmitt trigger;

FIG. 2a is a semi-schematic circuit diagram of a prior Schmitt trigger circuit design;

FIG. 2b is a semi-schematic circuit diagram of an exemplary inverter having its input shorted to the output in order to develop a threshold voltage;

DETAILED DESCRIPTION OF THE INVENTION

Prior to going into detail regarding the construction and operation of the novel input buffer according to practice of principles of the present invention, it will be informative to describe a generalized SCSI input receiver, capable of hosting such an input buffer, which operates with respect to high and low level input threshold voltages.

Figure 3:
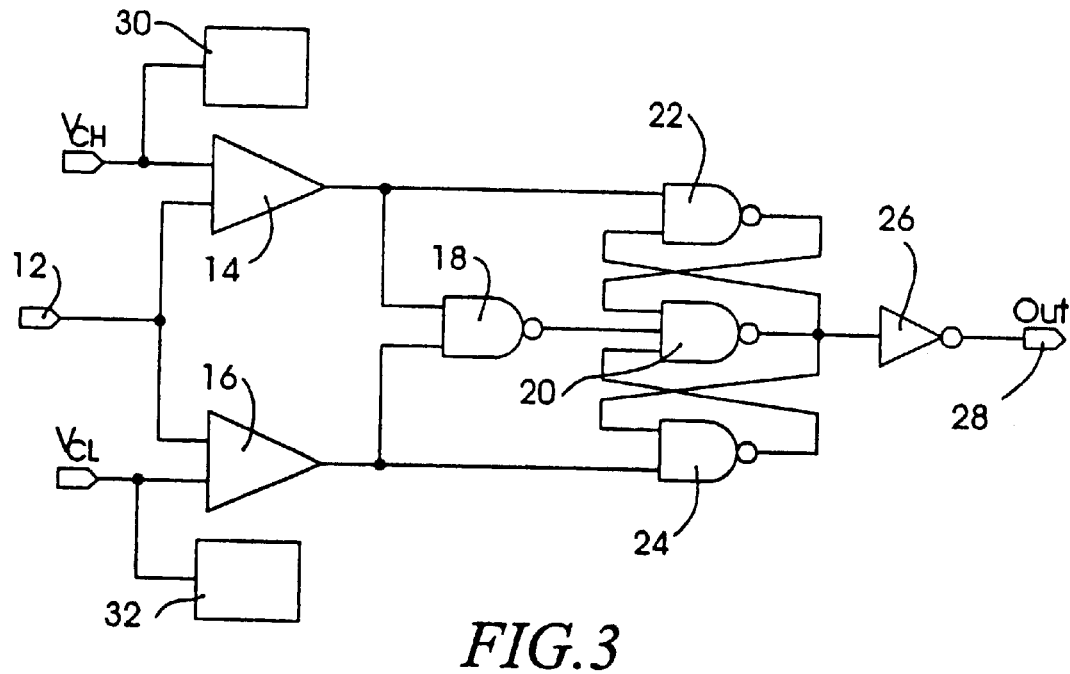
FIG. 3 is a semi-schematic block level diagram of an input receiver including high and low level input buffers in accordance with the present invention.

FIG. 3 depicts a semi-schematic block level diagram of such an SCSI input receiver, indicated generally at 10, which is connected to an SCSI signal at an input pad 12. An input signal is directed to first and second input buffers, 14 and 16 configured to provide a non-inverted output signal when the input either rises above a high level threshold $V_{IH}$ in the first buffer 14, or drops below a low level threshold $V_{IL}$ in the second input buffer 16. The outputs of the first and second buffers 14 and 16 are directed to the inputs of a 2-input NAND gate 18 whose output is connected to one of the inputs of a 3-input NAND gate 20 configured, in combination with 2-input NAND gate 22 and 2-input NAND gate 24 as a latch. The remaining two inputs of the 3-input NAND gate 20 are respectively taken from the outputs of 2-input NAND gates 22 and 24 each of which has one of its inputs taken from the output of the 3-input NAND gate 20. The remaining inputs of NAND gates 22 and 24 are taken from the output of the first and second input buffers, 14 and 16, respectively. The latch output is directed through an inverting buffer 26 to define the output 28 of the input receiver 10.

In operation, NAND gate 18 in combination with the latch comprising NAND gates 20, 22 and 24 functions to ensure that the output 28 does not switch from low-to-high or from high-to-low until the appropriate input thresholds ($V_{IL}$ or $V_{IH}$) have been past. In the case of a high-to-low going transition, as the input signal drops below $V_{IH}$, only one of the inputs to NAND gates 18 and 22 will change state. The output of the latch as well as the output 28 of the input receiver will not change state under those conditions. As the signal level at the input then falls below $V_{IL}$, both of the inputs to NAND gate 18 change state, as well as causing the NAND gates 20, 22 and 24 comprising the latch to change states and, thus, the output 28. The sequence is necessarily reversed in the case of a low-to-high going signal transition edge.

In order to ensure that the appropriate low and high level input threshold voltages are maintained, high and low threshold control voltages $V_{CH}$ and $V_{CL}$ are provided, respectively, to the first and second input buffers 14 and 16 by threshold setting master circuits 30 and 32 which define $V_{CH}$ and $V_{CL}$, respectively. As will be described in greater detail below, the threshold setting master circuits 30 and 32 define the threshold control voltages so as to maintain the internal switching thresholds of the input buffers, 14 and 16, at about ±5.0 percent of their nominal value across integrated circuit manufacturing process tolerance variations and across temperature excursions from 10° C. to 115° C.

Preferably, the $V_{CH}$ threshold setting master circuit 30 provides a control, or bias, voltage to the high level input buffer 14, which maintains the buffer's switching threshold at its nominal design value of about 1.65 volts. Likewise, the $V_{CL}$ threshold setting master circuit 32 provides a control, or bias, voltage to the low level input buffer 16, which maintains the buffer's switching threshold at its nominal design value of about 1.15 volts. Assuming power supply variations of approximately +/−5%, the nominal threshold voltages will be maintained to within +/−100 millivolts of their nominal design values, across process, temperature, and power supply corners.

Figure 4:
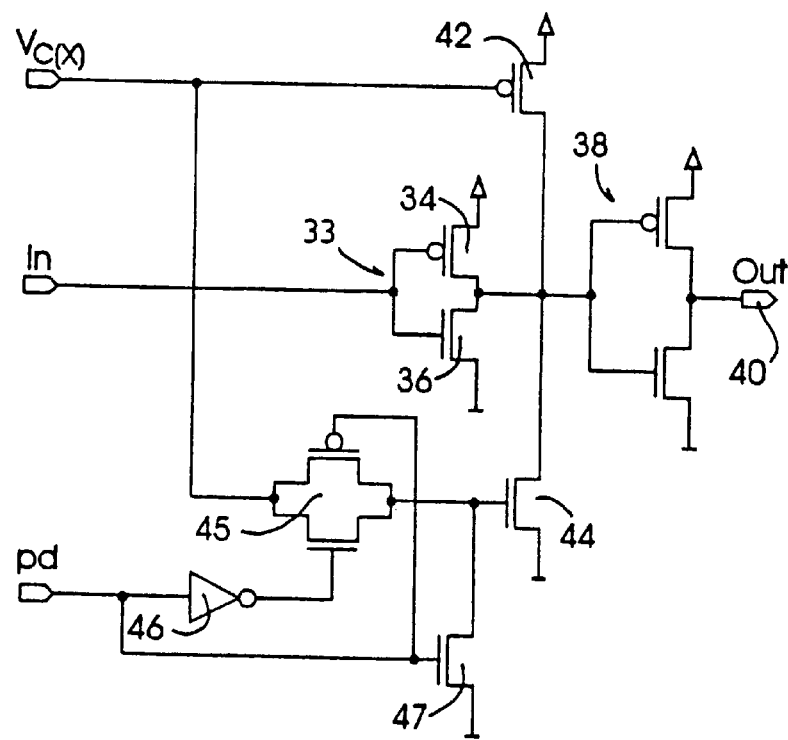
FIG. 4 is a semi-schematic circuit diagram of a portion of the input buffer of FIG. 3, further including power down circuitry.

Turning now to FIG. 4, there is depicted a semi-schematic circuit diagram of an exemplary input buffer, indicated generally at 14. Although the input buffer is denoted with numeral 14, indicating that it corresponds to the first, or high level input buffer of FIG. 3, it should be mentioned, here, that input buffers 14 and 16 of FIG. 3 are designed to be symmetrical and, thus, the exemplary circuit diagram of FIG. 4 pertains equally to both.

As depicted in FIG. 4, the input buffer 14 suitably comprises a first inverter constructed of a p-channel transistor 34 and an n-channel transistor 36 connected in conventional series fashion. The first inverter is constructed with its component transistors sized such that its nominal switching threshold point is equal to the desired switching threshold of the input buffer 14. In the case where the input buffer is configured as a high level input buffer, such that its nominal switching threshold point is nominally equal to 1.65 volts, the p-channel transistor 34 is constructed with a geometric width W of approximately 68 microns and a length L of approximately 1 micron. Similarly, the n-channel transistor is preferably constructed with a width of about 24 microns and a length of about 2 microns. In the case where the input buffer is configured as a low level buffer, such that its nominal switching point is equal to $V_{IL}$ nominally equal to 1.15 volts, the p-channel transistor is preferably constructed with width W of about 40 microns and a length L of about 2 microns, while the corresponding n-channel transistor is preferably constructed with a width W of about of about 44 microns and a length L of about 1 micron. The output of the first inverter is connected to the input of a second inverter, generally indicated at 38 which defines the non-inverting output 40 of the input buffer. Although depicted for purposes of completeness, the second inverter 38 functions only to condition the output of the buffer to an appropriate non-inverting state and has no impact on the construction or operation of the present invention. The second inverter 38 may, indeed, be omitted, to define an inverting output for each buffer 14 and 16, so long as the follow-on logic circuitry is modified accordingly.

As temperature, power supply voltage and manufacturing process parameter tolerances vary, the nominal switching threshold point of the first inverter will be understood to vary rather dramatically, particularly in response to variations in the geometric aspect ratios of the inverter's component transistors. In order to minimize the first inverter's switching threshold point variations, two current sources are coupled to the output of the first inverter and, by sinking or sourcing an amount of current which is likewise determined by temperature, power supply and process variations, compensate for the effects of temperature, power supply and process variations on the nominal switching point of the first inverter.

A first current source 42 is a p-channel transistor coupled between the output of the first inverter and the power supply voltage $V_{DD}$. A second current source 44 suitably comprises an n-channel transistor coupled between the output of the first inverter and ground potential. The gates of the current sources 42 and 44 are connected and operatively responsive to a bias voltage, termed herein a "threshold control voltage", indicated as $V_{C(x)}$. The (x) term indicates that the threshold control voltage may control (or bias) a high level input buffer ($V_{CH}$) or a low level input buffer ($V_{CL}$). As will be developed further, below, the threshold control voltage $V_{C(x)}$ biases the p- and n-channel current source transistors 42 and 44 with a temperature and process dependent bias, or control, voltage such that the current sources conduct in such manner so as to condition each respective inverter's actual switching threshold to be equal to the designed switching threshold across temperature and process corners.

For purposes of completeness and illustration only, the input buffer of FIG. 4 is illustrated with a power down (pd) circuit configured between the buffer's threshold control voltage input and the gate terminal of the n-channel current source transistor 44. The power down circuit suitably comprises a FET switch 45 and buffer 46 which function to open the circuit between the threshold input and the current source transistor 44. When power down is asserted, an n-channel transistor 47 shorts the gate terminal of the n-channel current source transistor 44 to ground potential, causing the n-channel current source 44 to turn-off and the output of the input buffer circuit to go to zero. While the power down circuit is depicted in the illustration of FIG. 4, it will be understood that its presence is immaterial to the function and operation of the input buffer according to practice of the present invention. Accordingly, the power down circuitry may be implemented in a variety of well known and conventional ways and may even be omitted without violating the scope or spirit of the present invention.

Regarding the current source transistors 42 and 44, they are constructed with relatively low W/L aspect ratios as compared to the W/L aspect ratios of the transistors comprising the first inverter. Thus, it will be understood that the current sourced or sunk by the current sources 42 and 44 will be correspondingly weak as compared to the current sourced or sunk by the transistors comprising the first inverter and will, therefore, have a minimal effect on circuit speed. Rather, the current source transistors 42 and 44 function to stabilize the switching threshold of the first inverter about the input buffer's nominal buffer switching threshold, by virtue of their gate terminals being tied to a corresponding threshold voltage, as described above. If the switching threshold of the first inverter was skewed low by, for example, process tolerance variations, a low-to-high input transition would cause the n-channel transistor 36 to begin to turn on and the p-channel transistor 34 to begin to turn off at a lower than expected value. In this case, the p-channel current source 42 would function to maintain the output of the first inverter at a high level, until such time as the input waveform reached the nominal buffer switching threshold and the first inverter current characteristics swamped those of the current source transistors.

In the case where the input buffer is configured as a high level buffer (having a switching threshold of $V_{IH}$ equal to 1.65 volts) the p-channel current source transistor 42 is preferably constructed with a width W of about 20 microns and a length L of about 1 micron. The corresponding n-channel current source transistor 44 is preferably constructed with a width W of about 10 microns a length L of about 3 microns. In the case where the input buffer is configured as a low level input buffer (having a nominal switching threshold of $V_{IL}$ equal to 1.15 volts), the p-channel current source transistor 42 is preferably constructed with a width W of about 15 microns and length L of about 1.5 microns, while the corresponding n-channel current source transistor 44 is preferably constructed with a width W of about 5 microns and a length L of about 2 microns.

Figure 5:
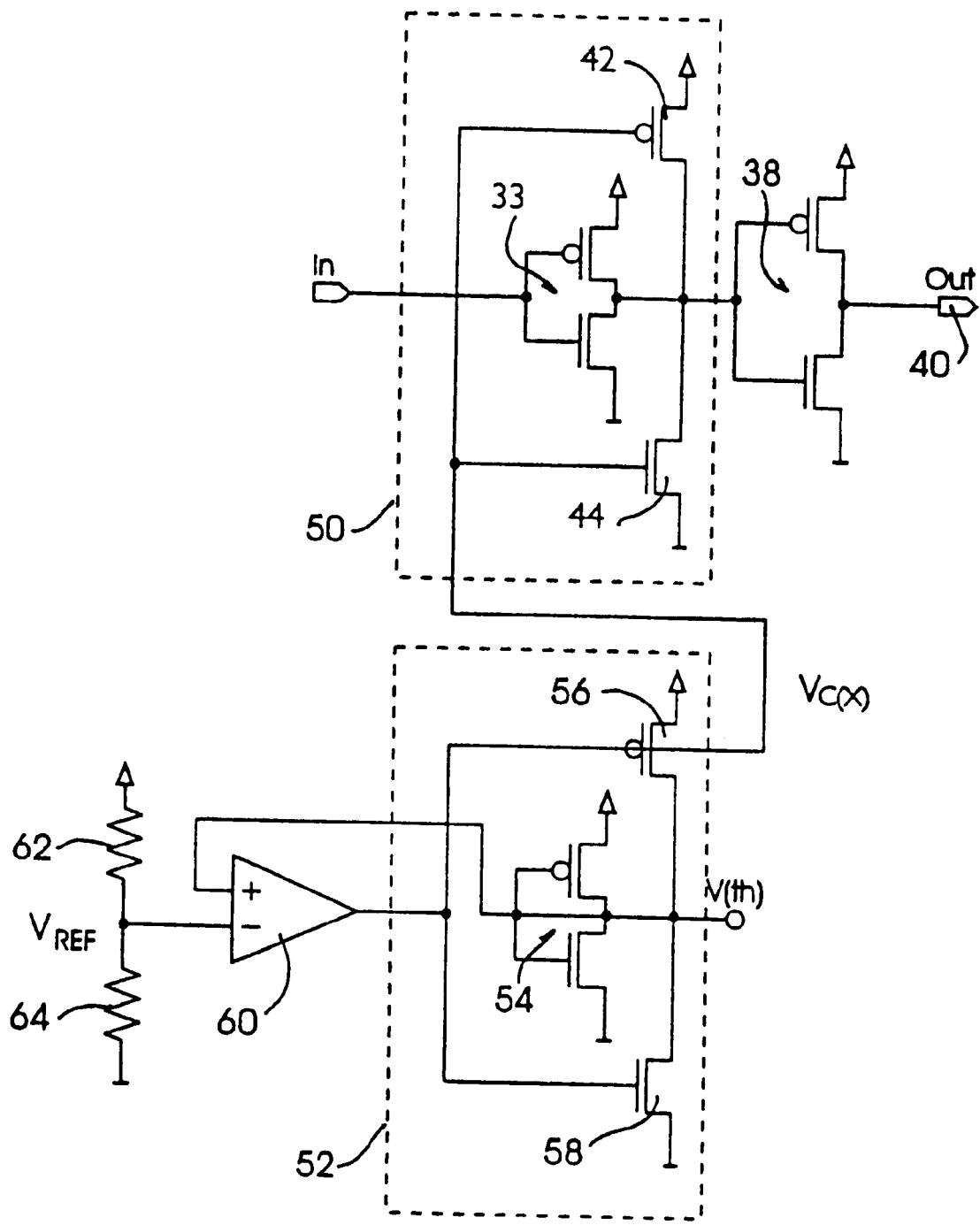
FIG. 5 is a semi-schematic circuit diagram of an input buffer and threshold setting master circuit portion of the input receiver of FIG. 3, illustrating the master/slave relationship between the input buffer circuitry and the threshold setting master circuit.

The bias, or control, voltages $V_{C(x)}$ provided to the current source transistors of FIG. 4 are dynamically developed by respective analog, threshold setting master circuits (30 and 32 of FIG. 3) which include suitable threshold setting reference circuits in combination with a copy of each respective input buffer which is, in turn, coupled to each input buffer in a master slave configuration, as illustrated in the semi-schematic circuit diagram of FIG. 5. In FIG. 5, the first inverter 33 and current source transistors 42 and 44 of the exemplary input buffer of FIG. 4 suitably comprise a slave circuit 50 driving a secondary inverter circuit 38 (corresponding to second inverter 38 of FIG. 4) whose output 40 comprises the output of the input buffer circuit (14 or 16 of FIG. 3). An exact copy of the slave circuit 50 is implemented as a master buffer circuit 52 wherein all of the component transistors forming the master buffer circuit 52 are constructed with identical integrated circuit layout geometries as the corresponding transistors of the slave circuit 50. In a manner similar to the slave circuit 50, the master circuit 52 also includes a first inverter 54 but, in contrast to the first inverter 33 of the slave circuit, the first inverter 54 of the master circuit 52 has its input shorted to the output so as to define the inverter's threshold voltage ($V_{th}$). The master circuit 52 further includes two current sources, a p-channel current source 56 connected between the first inverter's output and the power supply $V_{DD}$, and an n-channel current source transistor 58 coupled between the inverter's output and ground potential.

Since the input and output of the first inverter 54 are shorted together, the first inverter 54 necessarily defines an output voltage equal to its threshold voltage $V_{th}$. This output voltage is connected to the non-inverting input of an analog comparator circuit 60 where its analog value is compared to a reference voltage $V_{REF}$ developed by a threshold setting reference circuit suitably comprising first and second resistors 62 and 64 configured as a resistor divider network. Resistors 62 and 64 are preferably constructed as integrated circuit resistors and are ratioed such that the voltage value taken off the divider's center tap varies only with the power supply voltage $V_{DD}$ and is substantially independent of temperature and process tolerance variations. The voltage taken off the divider's center tap defines the reference voltage $V_{REF}$ and is coupled to the inverting input of the comparator 60 so as to be compared to the threshold voltage developed by the first inverter 54 of the master circuit 52. The output of the comparator 60 is coupled to the gate terminals of the master circuit's current source transistors 56 and 58 and functions to define a threshold control voltage ($V_{C(X)}$) which adjusts the switching threshold of the master circuit 52 such that it is equal to the reference voltage taken off the resistor divider's center tap.

The output of comparator 60 and, thus the control voltage $V_{C(X)}$ is likewise coupled to the gate terminals of the current source transistors of the slave circuit 50. Since the component transistors of the slave circuit are constructed to be identical to the component transistors of the master circuit, it will be evident that the control voltage $V_{C(X)}$ will have the same effect on the slave circuit, i.e., it will bias the slave circuit's current source transistors with a suitable bias voltage value such that the slave circuit's actual switching threshold point is adaptively adjusted to be equal to the reference voltage developed by the resistor divider network, i.e., the design switching threshold point.

It will be evident that the reference voltage $V_{REF}$ developed by the resistor divider network is designed to be equal to the respective high and low nominal buffer switching threshold points of the high and low input buffers (14 and 16 of FIG. 3). Where the circuit of FIG. 5 is implemented to develop a nominal low level threshold voltage, the resistors 62 and 64 preferably have impedance values of 65.7 KOhms and about 35.8 KOhms, respectively. Where the circuit of FIG. 5 is implemented to develop a nominal high level switching threshold, the resistors 62 and 64 comprising the divider are preferably constructed with impedances of about 47.8 KOhms and 53.8 KOhms, respectively.

In operation, the combination of the resistor divider comprising resistor 62 and 64, the analog comparator 60 and the inverter 54 function to define a control voltage $V_{C(X)}$ which varies with the degree of displacement of the inverter's actual threshold voltage from the designed threshold voltage defined by $V_{REF}$. As ambient temperature or integrated circuit process parameter shifts displace the inverter's threshold voltage in a more positive direction, the comparator 60 responds by developing a more positive going control voltage $V_{C(X)}$ which, in turn, increases conduction through the slave circuit's n-channel current source transistor 58 and decreases conduction through the p-channel current source transistor 56. Increased conduction to the n-channel transistor 58 functions to pull-down the slave circuit's output node to a value more closely approximating the design threshold voltage represented by $V_{REF}$. This action continues until the actual voltage value $V_{TH}$ read at the output of the slave circuit matches the reference voltage. The master circuit 52 is thus conditioned to have a switching threshold point equal to the design switching threshold point.

Since the slave circuit 50 is constructed with identical transistor geometries, it will be evident that applying the control voltage $V_{C(X)}$ to its current source transistors 42 and 44 will cause the output of the slave circuit 50 to exhibit the same actual switching threshold point as the master circuit 52. All that is required is that a suitable reference voltage $V_{REF}$ be defined and that the threshold switching point be adaptively adjusted to match the reference voltage. The master circuit 52 in combination with the comparator 60 and the resistor divider suitably comprises means to develop a bias, or control, voltage that, when applied to a secondary inverter configured as current sources, causes an output nodes switching threshold point to be adaptively dragged either higher or lower depending on the "sense" of the bias, or control, voltage. The control voltage, so developed, is then provided to an identical secondary inverter configured as current sources which adaptively condition an output node of an input buffer to switch about a designed switching threshold point substantially independent of temperature and integrated circuit manufacturing process tolerance variations.

Figure 6:
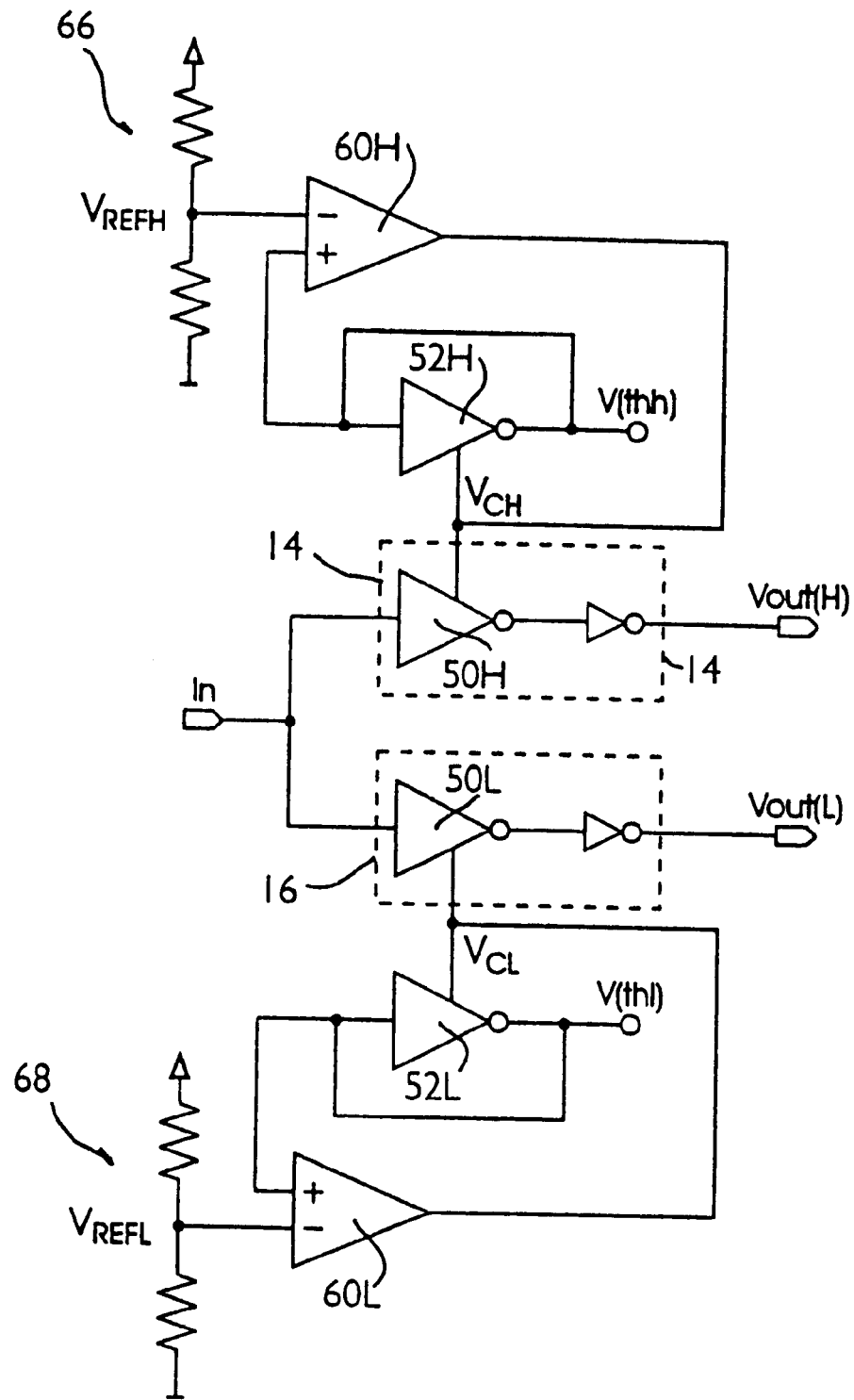
FIG. 6 is a semi-schematic block level diagram of the high and low level input buffers and high and low threshold setting master circuit portions of the input receiver of FIG. 3.

Turning now to FIG. 6, there is depicted in semi-schematic block diagram form, the novel switching threshold control voltage circuitry according to the invention, as it would be applied to a I/O cell such as that depicted in FIG. 3. For purposes of simplicity, elements identified in previous figures will be identified in FIG. 6 with the same reference numerals.

In FIG. 6, high and low level input buffers 14 and 16 suitably include respective slave elements 50H and 50L, each configured to receive an input signal and each configured to be controlled by a respective control voltage $V_{CH}$ and $V_{CL}$. The control voltages are developed by corresponding master circuits 52H and 52L configured to develop respective threshold voltages $V_{THH}$ and $V_{THL}$ by having their inputs and outputs shorted together. Each of the respective threshold voltages are compared in corresponding comparators 60H and 60L with reference voltages $V_{REFH}$ and $V_{REFL}$ developed by resistor divider networks 66 and 68, respectively.

It will be understood by those having skill in the art that $V_{REFH}$ developed by resistor divider network 66, is the nominal design switching threshold, of about 1.65 volts, of the high level input buffer 14. Likewise, $V_{REFL}$ developed across resistor divider network 68 is the nominal design switching threshold for the low level input buffer 16. When these input buffers, 14 and 16, are provided in combination with the logic circuitry depicted in FIG. 3, they suitably comprise a I/O cell having the appropriate switching and hysteresis characteristics necessary for connection to an SCSI bus.

Figure 7:
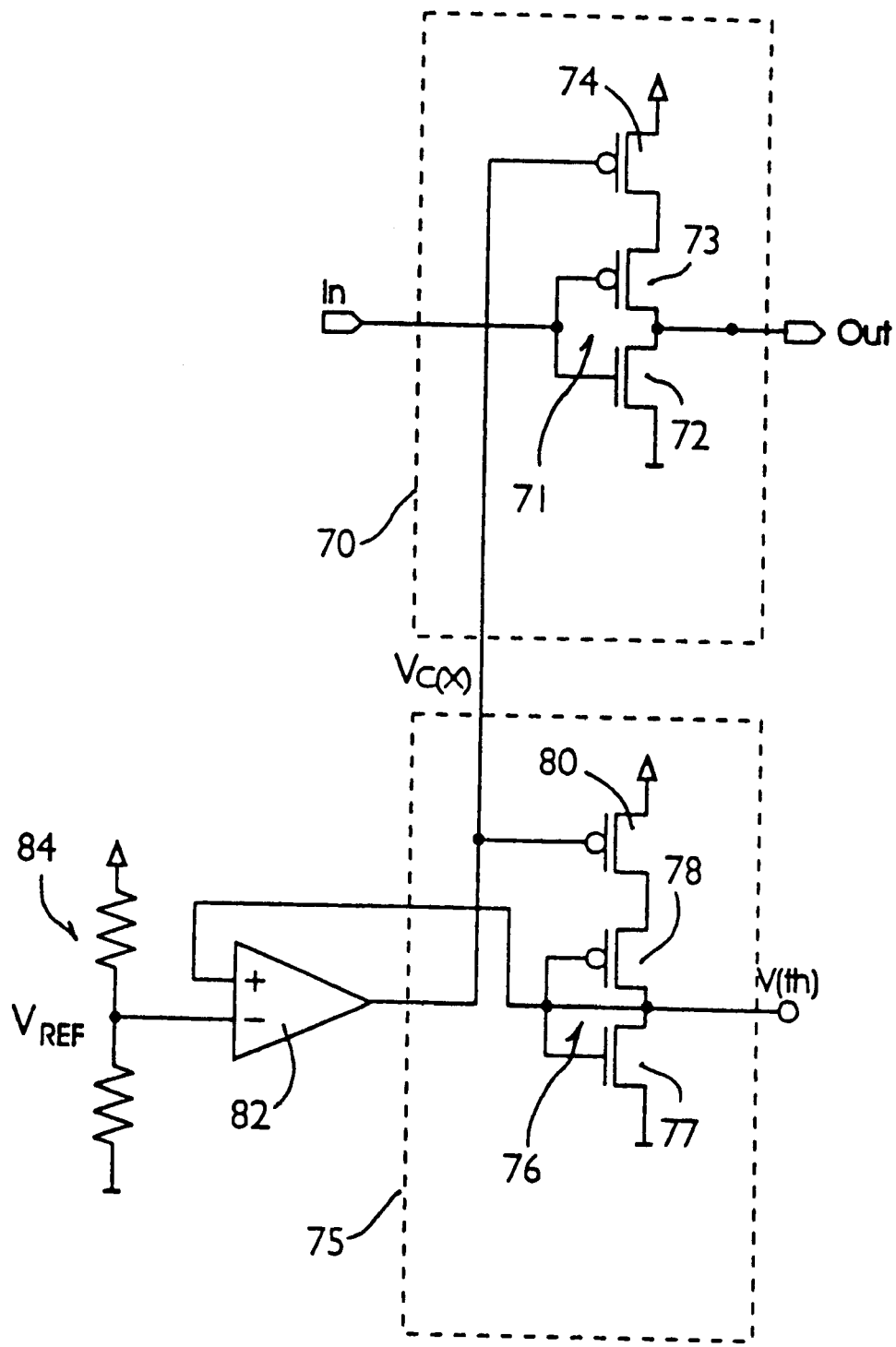
FIG. 7 is a semi-schematic circuit diagram of an alternative configuration of an input buffer and threshold setting master circuit combination using only a p-channel current source for low speed applications.

An alternative configuration of an input buffer and threshold setting master circuit combination which exhibits a similar degree of threshold voltage stability but is not particularly suitable for high speed operations is depicted in the semi-schematic circuit diagram of FIG. 7. When comparing the circuitry of FIG. 7 to the circuitry of FIG. 5, it will become evident that the circuits are generally similar, except that the alternative low-speed embodiment of FIG. 7 contemplates use of only a single p-channel current source transistor coupled in series-fashion to an invertor element. The alternative embodiment of FIG. 7 suitably comprises an input buffer 70 which includes an invertor 71 for receiving an input signal. The invertor 71 comprises an n-channel transistor 72 and p-channel transistor 73 pair having their drains connected in common to define the buffer's output. A p-channel current source transistor 74 is connected in series-fashion between the source terminal of the invertor's p-channel transistor 73 and the system's power supply voltage and includes a gate terminal connected and operatively responsive to a control voltage $V_C$ which conditions the p-channel current source transistor 74 to conduct more or less current such that the switching threshold of the invertor 71 is stabilized about its nominal design value.

As was the case in the previous embodiment, the invertor and current source which comprised the input buffer 70 are provided in mirror image fashion to define a threshold setting master circuit 75 which is constructed to include a geometrically similar invertor element 76 constructed of an n-channel transistor 77 and p-channel transistor 78 pair having their inputs and outputs connected together so as to define a switching threshold voltage, and a geometrically similar p-channel current source transistor 80 connected in series fashion between the p-channel transistor 78 of the invertor and the power supply voltage. As was the case in connection with FIG. 5, the switching threshold defined by the invertor element 76 is applied to the non-inverting input of a comparator 82, whose inverting input is taken from a reference voltage generating circuit comprising a resistor divider 84.

The circuit embodiment illustrated in FIG. 7 operates in a substantially similar manner to the circuit embodiment described in connection with FIG. 5, except that the embodiment of FIG. 7 is unsuitable for high speed operations. As will be well understood by those having skill in the art, the p-channel current source transistor 74 will necessarily be operating in saturation, thereby adding a resistive drop to the conduction path between the power supply and the invertor's p-channel 73. Accordingly, the output of the inverter is unable to swing all the way to the positive rail. Adding an additional component into the conduction path also causes the inverter's RC time constant to be lengthened because the added time required to charge and discharge the internal capacitances.

Thus, there has been brought to the art of SCSI input devices, an improved circuit and method for adaptively adjusting a bias, or control, voltage and providing that voltage to an input buffer to configure the input buffer to switch about its nominal design switching threshold point without regard to temperature or integrated circuit manufacturing process parameter variations. It will be recognized by those skilled in the art that various modifications may be made to the preferred and other embodiments of the invention described above, without departing from the broad inventive scope thereof. It will be understood, therefore, that the invention is not limited to the particular embodiments, arrangements or steps disclosed. It is rather intended to cover any changes, adaptations or modifications which are within the scope and spirit of the invention as defined by the appended claims.

What is claimed is:

1. In a high speed SCSI input receiver, an input buffer circuit comprising:

a switching circuit, connected to receive an input signal, the switching circuit including an input inverter defining an output at a common drain node thereof and first and second current sources connected to respectively source and sink current to and from the common drain node, the switching circuit configured to switch between low and high output states in response to the input signal traversing the input inverter's switching threshold voltage; and a threshold setting master circuit, including circuitry that substantially matches the operative circuitry of the switching circuit, the threshold setting master circuit connected to a reference voltage source and operative to define a control voltage for biasing the master circuit's current sources such that a switching threshold voltage of the master circuit's inverter element equals a precision voltage reference, wherein said control voltage further biases the current sources of the switching circuit so as to condition the switching circuit's inverter to exhibit a switching threshold voltage equal to the precision reference voltage.

2. A high speed input buffer circuit of a type configured for operation in connection with a high speed SCSI input receiver, the high speed input buffer circuit comprising:

an input inverter comprising series-connected n-channel and p-channel transistors, the input inverter defining an output at a common drain node;

a p-channel current source transistor coupled between a power supply and the common drain node;

an n-channel current source transistor coupled between the common drain node and a ground potential, wherein the n-channel and p-channel current source transistors each have gate terminals connected in common and configured to receive a control voltage, the control voltage causing the transistors to source or sink current to or from the common drain node so as to adaptively adjust a switching threshold voltage of the input inverter;

means for establishing a reference switching threshold voltage;

a master circuit including circuitry that substantially matches the operative circuitry of the input inverter; and comparison circuit for establishing a threshold reference voltage, the comparison circuit comparing the threshold reference voltage to a switching threshold voltage of the master circuit, the comparison circuit further defining a second control voltage which adaptively adjusts n-channel and p-channel current source transistors of the master circuit so as voltage to match the master circuit's switching threshold to the threshold reference voltage, the control voltage further biasing the n-channel and p-channel current source transistors of the input inverter circuit so as to maintain the input inverter's switching threshold voltage at a value substantially insensitive to normal temperature and process parameter variations.

* * * * *